United States Patent [19]

Dorris et al.

[11] Patent Number: 5,866,515

[45] Date of Patent: Feb. 2, 1999

[54] SUPERCONDUCTOR COMPOSITE

[75] Inventors: Stephen E. Dorris, La Grange Park, Ill.; Dominick A. Burlone; Carol W. Morgan, both of Asheville, N.C.

[73] Assignee: BASF Corporation, Mount Olive, N.J.

[21] Appl. No.: 504,330

[22] Filed: Jul. 19, 1995

[51] Int. Cl.⁶ .................................................. H01B 12/02
[52] U.S. Cl. ...................... 505/230; 505/231; 505/232; 505/236; 505/704; 174/125.1; 428/379; 428/457; 428/689; 428/930
[58] Field of Search ...................... 428/461, 379, 428/688, 689, 930, 457; 174/125.1; 505/230, 231, 236, 704, 783, 232

[56] References Cited

U.S. PATENT DOCUMENTS

| | | | |
|---|---|---|---|
| 3,617,358 | 11/1971 | Dittrich | 427/447 |
| 4,704,311 | 11/1987 | Pickering et al. | |
| 4,939,119 | 7/1990 | Iwata et al. | 505/401 |
| 5,098,178 | 3/1992 | Ortabasi | 428/930 |
| 5,104,849 | 4/1992 | Shiga et al. | 428/688 |
| 5,140,005 | 8/1992 | Rangaswamy et al. | 505/510 |
| 5,272,132 | 12/1993 | Gyorgy et al. | 505/430 |
| 5,334,579 | 8/1994 | Itozaki et al. | 505/783 |

OTHER PUBLICATIONS

Schwartz et al, "Fabrication, Current Density and Strain Dependence of Sintered. Ag–Sheathed Bi–Sr–Ca–Cu–O (2212) Single Filament and Multifilamentary Tape Superconductors", Transactions on Magnetics 27(2):1247 (1991).

*Primary Examiner*—Marie Yamnitzky
*Attorney, Agent, or Firm*—Nixon & Vanderhye, P.C.

[57] ABSTRACT

A superconducting conductor fabricated from a plurality of wires, e.g., fine silver wires, coated with a superconducting powder. A process of applying superconducting powders to such wires, to the resulting coated wires and superconductors produced therefrom.

10 Claims, 4 Drawing Sheets

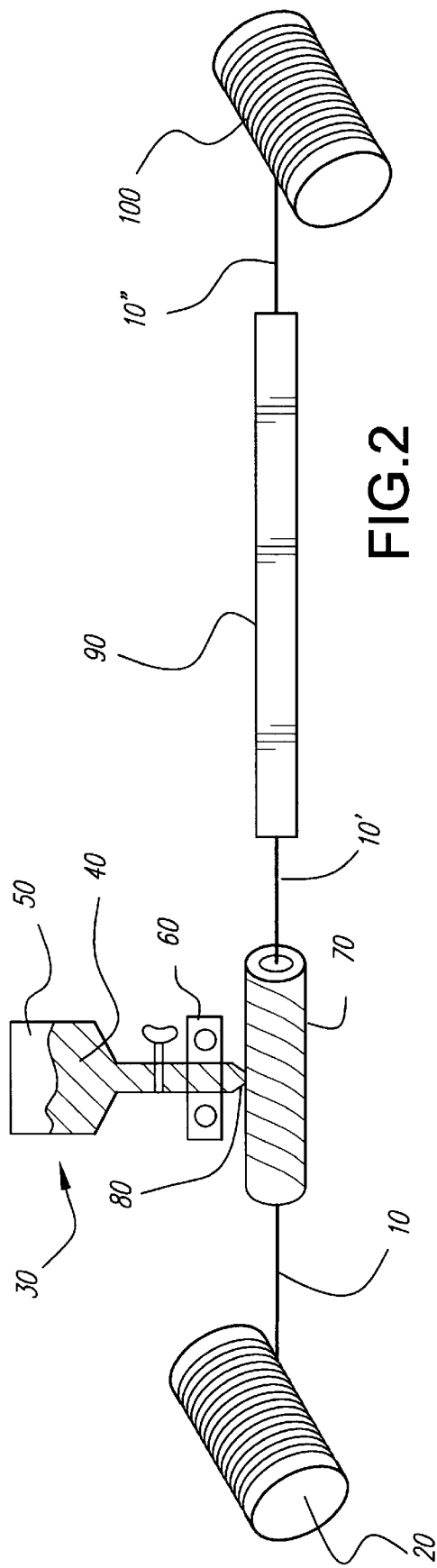
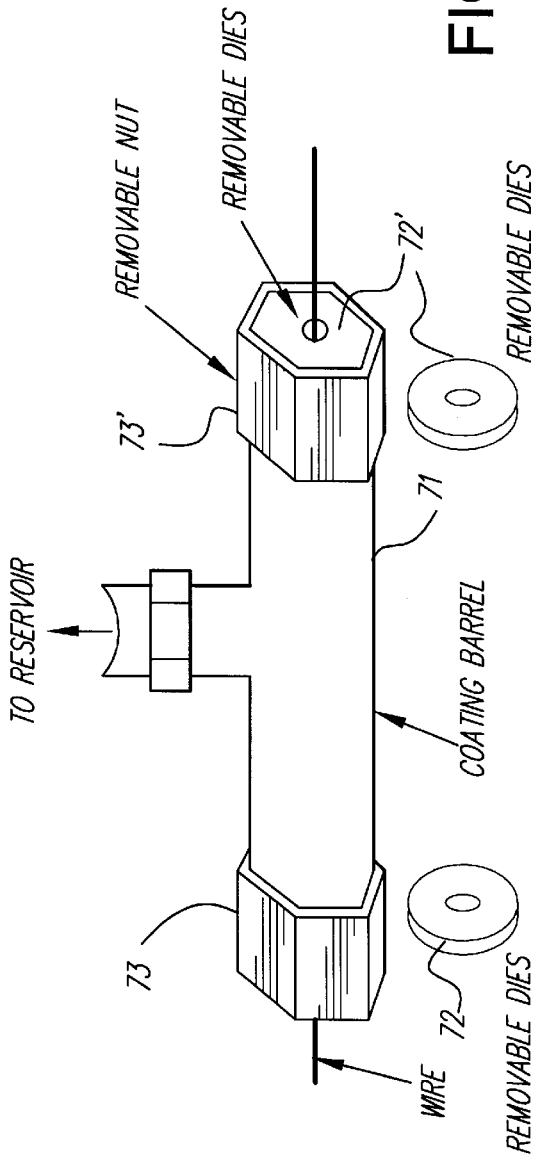

Ag tube
O.D.=6.35mm
I.D.=4.35mm
+
Coated Ag wires
wire dia.=0.5 mm
coating=0.15 mm thick
→
Bundle wires
and insert
into ag tube
FIG.4A
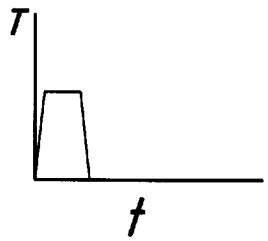
FIG.4B
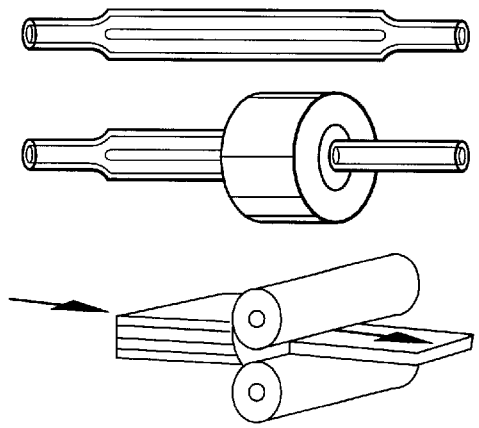
FIG.4C

5,866,515

SUPERCONDUCTOR COMPOSITE

TECHNICAL FIELD

The present invention relates to a superconducting conductor fabricated from a plurality of wires, e.g., fine silver wires, coated with a superconducting powder. The present invention also relates to a process of applying superconducting powders to such wires, to the resulting coated wires and superconductors produced therefrom.

BACKGROUND

Certain ceramic materials are known to superconduct at liquid nitrogen temperatures and, as a result, such materials have been used in the preparation of superconducting conductors. Conductors can be formed from silver tubes (sheaths) packed with the superconducting ceramic. At the interface between the tube and the superconductor core, grain growth and orientation of the ceramic is in a direction favoring conductivity. As a result, the superconducting properties in this region are enhanced.

The present invention capitalizes on the favorable grain orientation and enhanced properties which the silver/superconductor interface provides. More specifically, the present invention provides wires coated with superconducting powders (including ceramics) and a superconductor that incorporates such wires. The superconductors of the invention, comprising aggregates of fine, coated wires, have an increased silver/superconductor interfacial area.

OBJECTS AND SUMMARY OF THE INVENTION

It is a general object of the invention to provide a superconducting conductor comprising a sheath containing fine wires, e.g., silver wires, coated with superconducting powder. The inclusion of such coated wires greatly increases the interfacial area between the superconducting powder and the silver (or comparable material).

It is another object of the invention to provide a wire coated with a superconducting powder that can be used in the preparation of superconducting conductors having enhanced conductivity relative to prior superconductors (i.e., powder-in-tube type superconductors described above).

In accordance with that objective, the present invention provides a superconductor comprising a sheath containing a plurality of wires, for example, fine silver wires, coated with a superconducting powder. The powder can be applied to the wires as a dispersion containing the powder. Upon removal of any solvent that may be present, a superconductor powder/carrier coating is formed. Any carrier present can also be removed under conditions such that the powder remains coated on the wire.

Further objects and advantages of the invention will be clear from the description that follows.

BRIEF DESCRIPTION OF THE DRAWINGS

FIG. 2 is a longitudinal schematic of a further embodiment of the process of the present invention (showing optional drying tube).

FIG. 3 shows a coating applicator suitable for use in the present invention.

DETAILED DESCRIPTION OF THE INVENTION

The present invention relates to a superconducting superconductor fabricated from an aggregate of wires, for example, fine silver wires (eg fine continuous silver wires), coated with superconductor powder. The present invention also relates to a process of applying superconducting powder to a wire, specifically, a fine silver or silver alloy wire.

One embodiment of the coating process of the invention comprises forming a highly loaded dispersion of superconducting powder, feeding the dispersion from a reservoir to an applicator device as the wire is passed through the applicator device so that application of a coating of the superconductor powder dispersion to the wire occurs, and removing any solvent and/or carrier that may be present.

Figure 1:
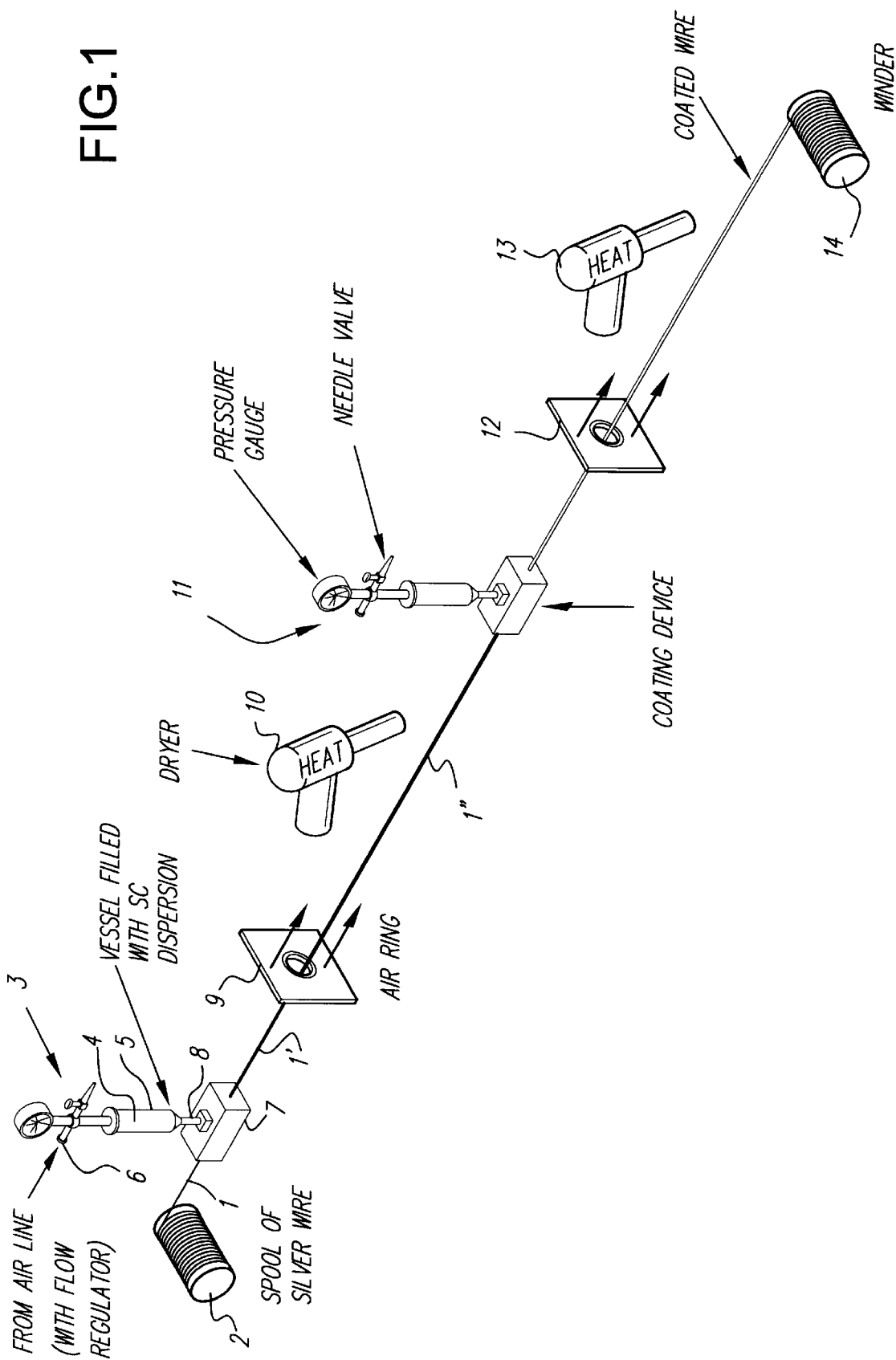
FIG. 1 is a longitudinal schematic of an embodiment of the process of the present invention.

FIG. 1 provides a schematic of one mode of carrying out the coating process of the invention. A wire substrate (1) travels from spool (2) to a coating application device (3). A dispersion of superconductor powder (4) is held in reservoir (5) and flows, under pressure (e.g., nitrogen pressure (eg 2–4 psi on the reservoir)) regulated by pressure regulator (6), to coating applicator (7) via dispersion conduit (8). As the wire substrate (1) passes through coating applicator (7), it contacts and is coated by dispersion (4) that flows at a rate regulated, in part, by pressure regulator (6) from reservoir (5). The dispersion-coated wire substrate (1') then passes through a drying zone that can include air ring (9) and/or air blower (10). The substantially solvent-free wire substrate (1") exits the drying zone and, optionally, travels to a second coating application device (11) (which includes a reservoir containing a further dispersion of superconducting powder that can be the same or different from dispersion (4)) and second drying zone that can include further air ring (12) and/or further air blower (13), prior to being wound around a winder (14). Typically, winder (14) pulls the wire substrate through the described process.

FIG. 2 provides a schematic of an alternative mode of carrying out the coating process of the invention. A wire substrate (10) travels from spool (20) to a coating application device (30). A dispersion of superconductor powder (40) is held in reservoir (50) and flows, or is pumped via optional pump (60), to coating applicator (70) via dispersion conduit (80). As the wire substrate (10) passes through the coating applicator (70), it contacts and is coated by dispersion (40) that flows (e.g., via gravity) or that is pumped (e.g., via pump (60)) from reservoir (50). The dispersion-coated wire substrate (10') then passes through a drying zone. Drying can be effected, for example, by merely causing air to blow over the dispersion-coated wire substrate (10') present in the open or, alternatively, the dispersion-coated wire substrate (10') can be passed through a drying tube (90). After the substantially solvent-free wire substrate (10") exits the drying zone, it is wound around a winder (100) which pulls the wire substrate (10) through the described process. As in the case of the embodiment shown in FIG. 1, multiple application devices, associated reservoirs and optional pumps can be placed in series.

The coating applicator can take a variety of forms, however, the use of an essentially closed applicator is preferred. Shown in FIG. 3 is a suitable applicator comprising a coating barrel (71) and a removable die (72 and 72') at each end thereof, each die being secured with a removable nut (73 and 73'). Dies suitable for use in the present applicators can be obtained, for example, from Brockton Jewel Bearing Co., Brockton, Mass. (see also U.S. Pat. No. 4,624,817).

While the process of the invention has been described in some detail by reference to the schematics of FIGS. 1 and 2, alternative coating applicator and application methodologies can be used. For example, applicators common to the textile industry can be used, including kiss roll, dip bath and padding applicators. Other alternative application methodologies include electrophoretic deposition of superconductor powder on a wire and spray deposition of superconductor powder on a wire (eg a charged wire).

When superconductor powder dispersions are used in the present invention those dispersions can include: a superconductor powder and a carrier and/or a solvent. Other elements can be present (e.g., dispersants) and each of the above elements can comprise a single component or a mixture or combination of components. The dispersion can include a superconductor powder and a carrier, a superconductor powder and a solvent or a superconductor powder, a carrier and a solvent.

A variety of superconducting powders are suitable for use in the present invention. The superconductor may be ceramic or non-ceramic. Exemplary ceramic superconductors include $(LaBa)_2CuO_4$, $YBa_2Cu_3O_7$ (YBCO); $Tl_2Ba_2Ca_2Cu_3O_{10}$; BSCCOs including $Bi_2Sr_2CaCu_2O_8$ and $Bi_{1.8}Pb_{0.4}Sr_{2.0}CA_{2.2}CU_{3.0}O_{10.6}$; $La_{1.85}Sr_{0.15}CuO_4$; $HgBa_2CuO_4$; $HgBa_2Ca_2Cu_3O_8$; $HgBa_2SrCa_2Cu_3O_8$; and doped fullerenes as well as many other ceramic superconductors. Exemplary non-ceramic superconductors include NbC; $V_3Si$; $Nb_3Ga$; $Nb_3Al_{0.75}Ga_{0.25}$ $Nb_3Sn$; NbTi alloys; NbTiZr alloys; NBTiTa alloys; $V_3Ga$; lead; and mercury. Presently, the preferred superconductor includes a BSCCO.

Superconductor particles suitable for use in the invention can be milled using a ball mill or other suitable mill and milling can be followed by filtering through a screen to remove large particles. In general, the majority of the particles are about 0.1–20 microns, 0.1–5 microns being preferred. The size can, of course, vary.

Carriers suitable for use in the present invention are compatible with the superconductor, result in the formation of a stable dispersion that can coat the wire substrate leaving an adherent superconductor coating after evaporation of solvent (when present), and are pyrolyzable without leaving a substantial residue (e.g., not more than about 0.3%, preferably, not more than about 0.1%). Suitable carriers include polyvinyl pyrrolidine (PVP), polyethylene oxides, polyacrylamide, polyvinylalcohol and polyacrylonitrile, PVP being preferred (available GAF Chemical Corporation, Wayne, N.J. and BASF AG, Ludwigshafen, Germany). When the dispersion of the invention includes superconductor powder and carrier (eg when the dispersion is solvent free or essentially solvent free), low melt temperature polymers (or copolymers) can be used as the carrier (eg polymers having a melt temperature of less than 70° C.). Examples of such polymers include polycaprolactone, polyalkenes (eg polyethylene) and polyalkylene oxides (eg polyethylene oxides).

When a solvent is used in the dispersion of the present invention, the solvent advantageously forms an inert environment for the superconductor powder and solubilizes the carrier. When PVP is the carrier, water, ethanol, n-butanol can be used. Lower aliphatic alcohols (up to $C_{10}$) are presently preferred.

The dispersion of the present invention can be prepared using a variety of methods, as will be clear from the Examples that follow. The superconductor powder can be combined with the solvent. Milling and/or sieving of the powder, as appropriate, can be carried out prior to the combination. Once combined, milling can also be carried out to effect formation of a uniform dispersion. Sonication can also be used. The powder/solvent can then be combined with the carrier and the resulting mixture homogenized using a variety of methodologies, use of a dispersator, a Premier Mill Corp., Model 89 dispersator being suitable.

One alternative approach to the preparation of the dispersion of the invention involves homogenizing the carrier in the solvent prior to addition of the superconductor powder (previously milled and/or sieved as appropriate). In a further alternative approach, all three components can be combined at once.

The dispersion of the invention is formulated so as to be sufficiently stable and viscous to permit essentially uniform application to the wire under the conditions (e.g., temperatures, etc) used. The loading of the superconductor component is preferably about 30–40% (w/w) of the dispersion. The preferred loading is about 35% (w/w). The weight percent of carrier in the dispersion can be about 10–15%(w/w).

Wire substrates suitable for use in the present invention can be any of a variety of materials, highly conductive materials, such as silver or silver alloys (e.g., silver doped with Pb and silver doped with magnesium), being preferred. The diameter of the wire is preferably in the range of 5 to 4000 microns, 25 to 2000 being more preferred and 50 to 1000 being most preferred.

The superconductor-coated wires of the invention have an average coating thickness of 5 to 4000 microns, preferably 25 to 2000 microns, more preferably 50 to 1000 microns. The coating thickness can vary with the diameter of the wire. As shown in the Examples, a 20–200 micron thick coating can be readily applied to a 127 micron diameter wire. The thickness of the coating also varies with the dispersion formulation, the rate with which the wire passes through the coater, the pressure on the reservoir (or the pump rate), the size of the die orifice, the number of coatings, the viscosity of the dispersion, etc.

The coatings of the wires resulting from the process described herein comprise about 5 to 95% superconductor, 30 to 85% being preferred and 60 to 80% being most preferred. The Examples set forth below result in a coating about 75% of which is superconductor.

Figure 4D:
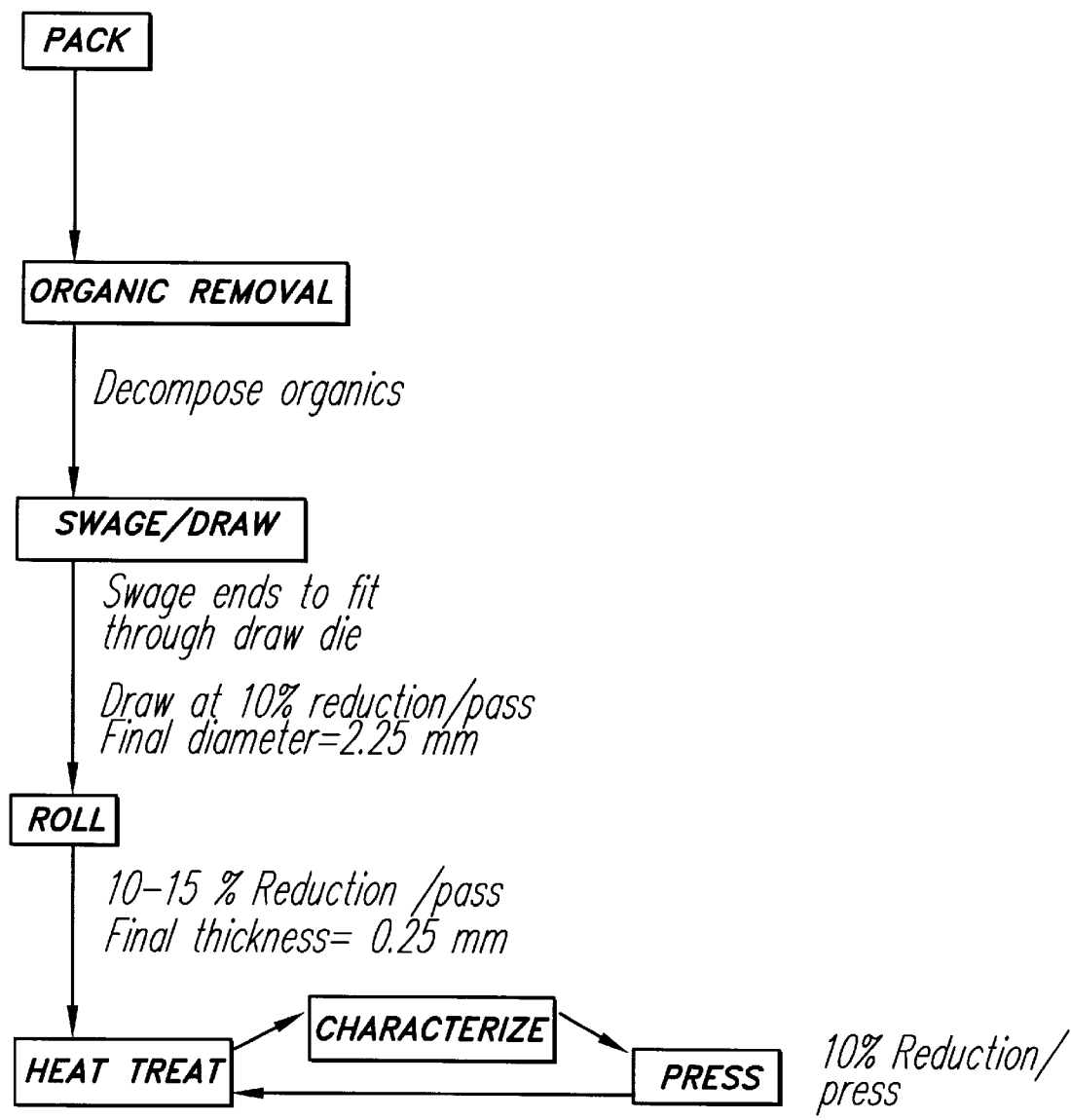
FIG. 4 is a schematic of coated wire-in-tube processing steps (the tube used in the described process has an outer to inner diameter ratio of 6.35/4.35).
Figure 4E:
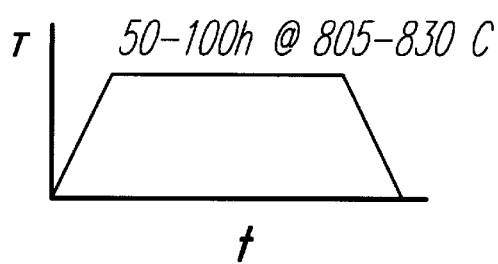
Figure 4F:
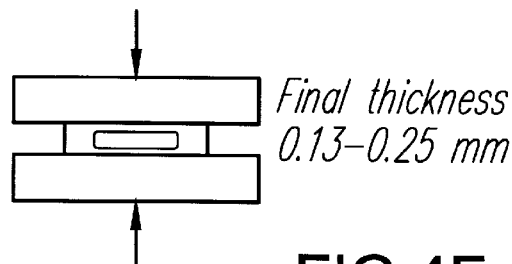

As noted above, aggregates of the coated wires can be used for fabricating superconducting conductors (wires, tapes, cables, etc). That is, the wires can be packed (axially aligned) in a tube (sheath), preferably a silver or silver alloy sheath and processed (e.g., drawn, etc. according to the process of Dorris et al, *Physica C*, 212:66 (1993)) to form the conductor. More specifically, the coated wires can be bundled and heated to remove organic carrier, then packed into a tube and processed into a conductor by a procedure such as that described by Dorris et al (*Physica C*, 212:66 (1993)), or the coated wires can be bundled and packed into a tube, then heated to remove the organic carrier and processed into a conductor (eg using the procedure of Dorris et al (*Physica C*, 212:66 (1993)). Tubes suitable for use as sheaths include tubes having inner diameters of 2 mm–20 mm. Tubes having larger inner diameters can also be used. When a tube having an inner diameter of 4.35 mm is used (see FIG. 4) 10–500 wires can be packed therein, preferably, 200–300 wires. When tubes having larger inner diameters are used, the number of wires can be increased accordingly. The number of wires packed in any particular sheath can vary with the coating thickness on the wires.

While reference is made above to the packing of coated wires into a tube (sheath), the present invention also relates to the method of fabricating a superconducting superconductor that comprises placing (packing) wire cores in a tube (sheath) and then coating the packed wires with superconductor powder. In this embodiment, a superconductor powder-containing dispersion can be passed through the sheath and thereby over the surface of wire cores present therein. The solvent and/or carrier can then be removed as described above.

Certain aspects of the present invention are described in greater detail in the non-limiting Examples that follow.

EXAMPLE 1

One hundred and fifty grams of Bismuth-Strontium-Calcium-Copper Oxide 2212 ($Bi_{1.8}Pb_{0.4}Sr_2Ca_1CU_2$—a BSCCO) superconductor powder was combined with 300 g of ethyl alcohol. The dispersion was ball milled for 3.5 hours in a 0.95 liter jar. After milling, some of the ethanol was evaporated and one third of the remaining dispersion was combined with polyvinylpyrrolidone (PVP) powder to create a mixture consisting of 33% superconductor powder, 11% PVP and 56% alcohol. The mixture was homogenized using a Premier Mill Corp., Model 89 dispersator. The mixture was then placed in a small vessel which gravity fed the mixture to a coating applicator whose inlet and outlet orifice diameters were 0.019 inches. Nichrome wire with a diameter of 100 microns was passed through the coater at a speed of 10.3 meters/min and wound onto a spool. Superconductor-coated nichrome wire with an average coating thickness of 19 microns was produced.

EXAMPLE 2

Example 1 was repeated except that the coating mixture consisted of 37.5% BSCCO, 12.5% PVP and 50% ethanol and the winder take-up speed was 2.8 m/min. A superconductor-coated nichrome wire with an average coating thickness of 48 microns was obtained.

EXAMPLE 3

Example 1 was repeated except that a 127 micron silver wire was used in place of the nichrome wire, the coating mixture consisted of 37.5% BSCCO, 12.5% PVP and 50% ethanol and the winder take-up speed was 1.1 m/min. In this case, a superconductor-coated silver wire with an average coating thickness of 22 microns was obtained.

EXAMPLE 4

One hundred and fifty grams of Bismuth-Strontium-Calcium-Copper Oxide 2212 ($Bi_{1.8}Pb_{0.4}Sr_2Ca_1Cu_2$) superconductor powder was combined with 300 g of ethyl alcohol. The dispersion was ball milled for 3.5 hours in a 0.95 liter jar. After milling, some of the ethanol was evaporated. One third of the remaining dispersion was combined with PVP powder to create a mixture consisting of 33% BSCCO, 11% PVP and 56% ethanol. The mixture was homogenized and placed in a small vessel which gravity fed the mixture to a coating applicator whose inlet and outlet orifice diameters were 0.019 inches. Another third of the milled dispersion was combined with PVP powder to create a mixture consisting of 41% superconductor powder, 14% PVP and 45% ethanol. This mixture was homogenized placed in its own small vessel which gravity fed the mixture to a second coating applicator whose inlet and outlet orifice diameters were 0.023 inches. Silver wire with a diameter of 127 microns was passed through the coater at a speed of 0.34 meters/min. and wound onto a spool. Superconductor-coated silver wire with an average coating thickness of 72 microns was produced.

EXAMPLE 5

Sixty-nine grams of a mixture of 1 mole-part of Bismuth-Strontium-Calcium-Copper Oxide 2212 ($Bi_{1.8}Pb_{0.4}Sr_2Ca_1Cu_2$) superconductor powder and 1 mole-part of $CaCuO_2$ was sieved through a 60 mesh sieve. The powder was dispersed in 100 g of ethanol and put in a sonic bath for 45 minutes, keeping the bath cool to prevent heating of the alcohol. PVP powder was added to one half of this dispersion to create a mixture consisting of 36% superconductor mixture, 12% PVP and 52% ethanol. The mixture was homogenized and placed in a small vessel which gravity fed the mixture to a coating applicator having inlet and outlet diameters of 0.019 inches. To the other half of the dispersion, PVP powder was added to create a mixture consisting of 37.5% superconductor mixture, 12.5% PVP and 50% ethanol. This second mixture ball milled for 3.5 hours in a 0.95 liter jar. After milling, some of the ethanol was evaporated. One third of the remaining dispersion was combined with polyvinylpyrrolidone (PVP) powder to create a mixture consisting of 33% superconductor mixture, 11% PVP and 56% ethanol. The mixture was homogenized and placed in a small vessel which gravity fed the mixture to a coating applicator having inlet and outlet orifice diameters of 0.019 inches. Another third of the milled dispersion was combined with PVP powder to create a mixture consisting of 41% superconductor powder, 14% PVP and 45% ethanol. This mixture was homogenized placed in its own small vessel which gravity fed the mixture to a second coating applicator whose inlet and outlet orifice diameters were 0.023 inches. Silver wire with a diameter of 127 microns was passed through the coaters at a speed of 0.34 meters/min. and wound onto a spool. Superconductor-coated silver wire with an average coating thickness of 72 microns was produced.

EXAMPLE 6

Sixty-nine grams of a mixture of 1 mole-part Bismuth-Strontium-Calcium-Copper Oxide 2212 ($Bi_{1.8}Pb_{0.4}Sr_2Ca_1Cu_2$) superconductor powder and 1 mole-part CaCuO2 was sieved through a 60 mesh sieve. The powder was dispersed in 100 g of ethanol and put in a sonic bath for 45 minutes, keeping the bath cool to prevent heating of the ethanol. PVP powder was added to one half of this dispersion to create a mixture consisting of 36% superconductor mixture, 12% (PVP) and 52% ethanol. The mixture was homogenized and placed in a small vessel which gravity fed the mixture to a coating applicator whose inlet and outlet diameters were 0.019 inches. To the other half of the dispersion, PVP powder was added to create a mixture consisting of 37.5% superconductor mixture, 12.5% PVP and 50% ethanol. This second mixture was homogenized and placed in a small vessel which gravity fed the mixture to a coating applicator whose inlet and outlet orifice diameters were 0.022 inches. A silver wire with an average diameter 127 microns was run through the coaters at a rate of 0.56 m/min. A silver wire with an average diameter of 127 microns was run through the coaters at a winding speed of 0.56 m/min. A silver wire coated with superconductive powder mix with an average coating thickness 78 microns was obtained.

EXAMPLE 7

Ten grams of PVP powder was combined with 50 g of ethanol and homogenized on a Premier Mill Corp., Model 89 dispersator. Separately, Yittrium-Barium-Copper-Oxide (YBCO or 123) superconductor powder was sieved through a 60 mesh screen. Thirty grams of the 123 powder was added to the ethanolic PVP solution to create a mixture consisting of 33% superconductor, 11% PVP and 56% ethyl alcohol. The mixture was then placed in a small vessel which gravity fed the mixture to a coating applicator whose inlet and outlet orifice diameters were 0.019 inches. Nichrome wire with a diameter of 100 microns was pulled through the coater at a rate of 0.26 m/min and wound onto a spool. A nichrome wire coated with superconductive powder mix with an average coating thickness of 44 microns was obtained.

EXAMPLE 8

One hundred and twenty five grams of a mixture of approximately 1 mole part Bismuth-Strontium-Calcium-Copper Oxide 2212 ($Bi_{1.8}Pb_{0.4}Sr_2Ca_1CU_2$) superconductor powder and 1 mole-part $CaCuO2$ was sieved through a 60 mesh sieve. The powder was dispersed in 148 g of ethanol and put in a sonic bath for 1.5 hrs, keeping the bath cool to prevent heating of the ethanol. PVP powder was added to one half of this dispersion to create a mixture consisting of 40% superconductor mixture, 13% PVP and 47% ethanol. The mixture was homogenized and divided into two portions. Each was placed in a small vessel which fed the mixture to a coating applicator. The first coater contained dies having inlet and outlet diameters of 0.019 inches. The second coater contained dies having inlet and outlet diameters of 0.022 inches. Each coating vessel was pressurized with air to control the flow of superconductor dispersion. A silver wire with an average diameter of 127 microns was run through the coaters at a speed of 0.35 m/min and wound onto a spool. A silver wire coated with superconductive powder mix with an average coating thickness of 164 microns was obtained.

EXAMPLE 9

The process of preparing a superconductor of the invention began with a spool of 125 μm diameter silver wire coated with Bi-2223 precursor powder (the "two-powder" mixture described by Dorris et al (*Physica C*, 212:66 (1993)) containing (Bi, Pb)-2212+$CaCuO_2$). The Bi-2223 coating thickness was approximately 70 μm. Wire was unspooled and cut into 180 mm lengths. One hundred fifty coated wires each 180 mm long were picked up individually and held so that the ends were together. A thin-walled silver band (5.85 mm inside diameter/6.35 mm outside diameter/approximately 6 mm long) was slipped just over the end of the wires being held together. The end of an uncoated silver wire 500 μm diameter×300 mm long was inserted into the band in such a way that the major portion (approximately 290 mm) of the uncoated wire extended out of the band and away from the coated wires. (The uncoated silver wire was used to pull the bundle of coated wires into a silver tube (sheath) for mechanical processing.) The thin silver band was crimped tightly onto the bundle of coated wires and single uncoated wire.

The silver band holding the coated wires and the single uncoated wire was then passed through a grooved roll (e.g., Macbee Engineering Corporation Model "A" Hand Pointer, a 2.5 inch diameter grooved mill) to reduce its diameter enough for it to slide freely into a silver tube that was open at both ends and whose inside diameter was 4.35 mm and outside diameter was 6.35 mm and whose length was approximately 260 mm. The bundle of coated wires was then loaded into the silver tube by first sliding the single uncoated silver wire through the silver tube so that the end of the wire protruded from the other end of the tube. The bundle was then pulled into the tube by slowly pulling on the uncoated silver wire and gently squeezing the bundle as it entered the tube. The bundle was pulled until it was centered inside the tube. At this point, the tube extended approximately 40 mm past each end of the bundle. Organics were removed from the superconductor coating by heating the silver tube in a furnace (e.g., Lindberg Model #58474-P) at a rate of 5° C./min up to a temperature of 450° C., then 10° C./min up to 720° C., then holding for 24 h at 720° C., then cooling to room temperature at a rate of 2° C./min. The atmosphere in the furnace during organic removal was one of flowing oxygen maintained at a pressure 2–5 torr.

After organic removal, approximately 50 mm of each end of the tube was swaged down to a diameter of 4.75 mm so that the wires were firmly gripped inside the ends of the silver tube. The tube was then processed into tape by the drawing and rolling process described by Dorris et al (*Physica C,* 212:66 (1993)). After processing, the tape had dimensions of approximately 400 cm×0.5 cm×0.025 cm. Samples approximately 3.0 cm long were cut from the tape and heat treated in the range of 810°–820° C. according to the heat treatment schedule described in Dorris et al (Physica C, 212:66 (1993)). Heat treatments were done in an atmosphere of 8% $O_2$ at ambient pressure.

All documents cited above are hereby incorporated in their entirety by reference.

One skilled in the art will appreciate from a reading of this disclosure that various changes in form and detail can be made without departing from the true scope of the invention.

What is claimed is:

1. A superconductor composite comprising a sheath and a plurality of wires coated with a superconductor wherein said superconductor composite is prepared by coating said wires with superconducting powder so that coated wires are formed and inserting said coated wires into said sheath so that said coated wires are in axial alignment with said sheath and so that superconductor coatings on adjacent wires present in the sheath are contiguous.

2. The superconductor composite according to claim 1 wherein said wires and said sheath comprise silver.

3. The superconductor composite of claim 1 wherein said coated wires are co-extensive with the length of said sheath.

4. A superconductor composite comprising a sheath and a plurality of wires coated with a superconductor wherein said wires are present in said sheath in axial alignment therewith and so that superconductor coatings on adjacent wires present in the sheath are contiguous.

5. The superconductor composite according to claim 4 wherein said wires and sheath comprise silver.

6. A superconductor composite consisting essentially of a sheath and a plurality of wires coated with a superconductor wherein said superconductor composite is prepared by coating said wires with superconducting powder so that coated wires are formed and inserting said coated wires into said sheath so that said coated wires are in axial alignment with said sheath and so that superconductor coatings on adjacent wires present in the sheath are contiguous.

7. The superconductor composite according to claim 6 wherein said wires and said sheath are silver.

8. The superconductor composite of claim 6 wherein said coated wires are co-extensive with the length of said sheath.

9. A superconductor composite consisting essentially of a sheath and a plurality of wires coated with a superconductor wherein said wires are present in said sheath in axial alignment therewith and so that superconductor coatings on adjacent wires resent in the sheath are contiguous.

10. The superconductor composite according to claim 9 wherein said wires and sheath are silver.

* * * * *

UNITED STATES PATENT AND TRADEMARK OFFICE
CERTIFICATE OF CORRECTION

PATENT NO. : 5,866,515
DATED : February 2, 1999
INVENTOR(S) : Dorris et al.

It is certified that error appears in the above-indentified patent and that said Letters Patent is hereby corrected as shown below:

At column 1, under the title "Superconductor Composite", please insert the following paragraph:

"This invention was made with Government support under Subcontract No. ANL-P-85703 under Contract No. W-31-109-ENG-38 awarded by the Department of Energy. The Government has certain rights in this invention."

Signed and Sealed this

Seventh Day of September, 1999

Attest:

Q. TODD DICKINSON

Attesting Officer

Acting Commissioner of Patents and Trademarks

UNITED STATES PATENT AND TRADEMARK OFFICE
CERTIFICATE OF CORRECTION

PATENT NO. : 5,866,515
DATED : February 2, 1999
INVENTOR(S) : Dorris et al.

It is certified that error appears in the above-indentified patent and that said Letters Patent is hereby corrected as shown below:

In claim 9, column 8, line 59, please delete "resent" after "wires" and replace it with "present".

Signed and Sealed this

Fourth Day of January, 2000

Attest:

Attesting Officer

*Acting Commissioner of Patents and Trademarks*